United States Patent [19]

Tanaka et al.

[11] Patent Number: 5,501,175
[45] Date of Patent: Mar. 26, 1996

[54] PROCESS FOR PREPARING HIGH CRYSTALLINITY OXIDE THIN FILM

[75] Inventors: So Tanaka; Michitomo Iiyama, both of Osaka, Japan

[73] Assignee: Sumitomo Electric Industries, Ltd., Osaka, Japan

[21] Appl. No.: 269,777

[22] Filed: Jul. 1, 1994

[30] Foreign Application Priority Data

Jul. 2, 1993 [JP] Japan .................................. 5-190854
Jul. 19, 1993 [JP] Japan .................................. 5-200016

[51] Int. Cl.$^6$ ...................... C30B 23/08; C23C 14/08; C04B 35/00
[52] U.S. Cl. ...................... 117/108; 117/949; 505/238; 437/42
[58] Field of Search .................. 117/103, 108, 117/93, 949; 437/105, 42; 505/190, 191, 192, 193, 730, 732, 320, 238

[56] References Cited

U.S. PATENT DOCUMENTS

| | | | |
|---|---|---|---|
| 4,981,714 | 1/1991 | Ohno et al. | 427/39 |
| 5,039,657 | 8/1991 | Goldman et al. | 505/193 |
| 5,108,984 | 4/1992 | Shioya et al. | 505/732 |
| 5,135,906 | 8/1992 | Harada et al. | 505/1 |
| 5,227,363 | 7/1993 | Furukawa et al. | 505/730 |
| 5,236,895 | 8/1993 | Nishiyama et al. | 505/730 |
| 5,260,267 | 11/1993 | Harada et al. | 505/730 |
| 5,264,413 | 11/1993 | Bozovic et al. | 505/1 |
| 5,278,136 | 1/1994 | Bednorz et al. | 437/42 |
| 5,361,720 | 11/1994 | Evetts et al. | 117/91 |
| 5,372,992 | 12/1994 | Itozaki et al. | 505/238 |
| 5,378,683 | 1/1995 | Cabanel et al. | 505/190 |

FOREIGN PATENT DOCUMENTS

| | | |
|---|---|---|
| 0285999 | 12/1988 | European Pat. Off. . |
| 0426570 | 8/1991 | European Pat. Off. . |

*Primary Examiner*—Mary Wilczewski
*Attorney, Agent, or Firm*—Kerkam, Stowell, Kondracki & Clarke; John C. Kerins

[57] ABSTRACT

A process for preparing an oxide thin film which has a crystalline, clean and smooth surface on a substrate. The process is conducted by using an apparatus comprising a vacuum chamber in which an oxidizing gas of $O_2$ including $O_3$ can be supplied near the substrate so that pressure around the substrate can be increased while maintaining high vacuum near an evaporation source and Knudsen cell evaporation sources arranged in the vacuum chamber wherein the substrate is heated, molecular beam of constituent atoms of the oxide excluding oxygen are supplied from the K cell evaporation sources and an oxidizing gas is locally supplied to the vicinity of the substrate.

16 Claims, 4 Drawing Sheets

PROCESS FOR PREPARING HIGH CRYSTALLINITY OXIDE THIN FILM

BACKGROUND OF THE INVENTION

1. Field of the Invention

The present invention relates to a process for preparing oxide thin films having excellent flatness and high crystallinity, and more specifically to an improved MBE (Molecular Beam Epitaxy) process so called a reactive co-evaporation process particularly for preparing thin films of oxide insulator or dielectric mateials, which have clean and smooth surfaces, high crystallinity and excellent properties.

2. Description of Related Art

Oxide thin films have been widely used as insulating layers and protective layers for semiconductor devices. Oxide thin films are also used as insulating layers and barrier layers of superconducting devices utilizing oxide superconductor materials which have been recently advanced in study, for example, Y-Ba-Cu-O type oxide superconductor having a critical temperature higher than 80K, Bi-Sr-Ca-Cu-O type oxide superconductor and Tl-Ba-Ca-Cu-O type oxide superconductor having critical temperatures higher than 100K.

Since interactions among superconducting particles, such as Cooper pairs, through insulating layers are necessary for operating the superconducting devices and to high breakdown voltage is required for the insulating layers of control electrodes, the oxide thin films utilized in the superconducting devices should be more homogeneous and should have higher crystallinity and smoother surfaces than that of a semiconductor device.

In addition, the superconducting devices often include stacked structures formed of oxide superconductor thin films and nonsuperconductor thin films. For example, a tunnel type Josephson junction comprises a stacked structure of a first oxide superconductor layer, an thin insulator layer and a second oxide superconductor layer stacked in the named order.

A superconducting field effect device, a candidate of realistic three-terminal superconducting devices, has a superconducting channel and a gate electrode formed on the superconducting channel through a gate insulating layer. If a superconducting field effect device consists of a superconducting channel of an oxide superconductor, it is necessary to stack an oxide superconductor thin film, an insulator thin film and a conductor film.

In order to fabricate a superconducting multi-layer wiring structure by using an oxide superconductor, oxide superconductor thin films and insulator thin films should be alternately stacked.

All of above superconducting devices and elements require high quality thin films. Namely, oxide superconductor thin films and other thin films preferably should have excellent properties originated by high crystallinity. It is more preferable that the thin films are formed of single crystals. If one of the thin films is formed of polycrystals or amorphous state, the device or the element may have degraded characteristics or may not even operate.

Additionally, in the above superconducting devices and elements, junctions between the two thin films are also important. It is preferable that there is no inter diffusion through the junction interfaces, therefore, there should exist clear interfaces. In particular, if constituent elements of the nonsuperconductor thin films diffuse into the oxide superconductor thin films, superconducting properties of the oxide superconductor thin films are fairly degraded, and vice versa.

SUMMARY OF THE INVENTION

Accordingly, it is an object of the present invention to provide a process for preparing an oxide thin film having clean and smooth surfaces with high crystallinity and excellent properties, which has overcome the above mentioned defects of the conventional ones.

Another object of the present invention is to provide a process for preparing an oxide thin film on an oxide superconductor thin film without inter diffusion, which has overcome the above mentioned defects of the conventional ones.

The above and other objects of the present invention are achieved in accordance with the present invention by a process for preparing a film formed of an oxide material on a substrate by using an apparatus comprising a vacuum chamber in which an oxidizing gas of $O_2$ including $O_3$ can be supplied near the substrate so that pressure around the substrate can be increased while maintaining high vacuum around an evaporation source and evaporation sources of Knudsen cell (K cell) arranged in the vacuum chamber wherein the substrate is heated, molecular beam of constituent atoms of the oxide excluding oxygen are supplied from the K cells and an oxidizing gas is locally supplied to the vicinity of the substrate.

In accordance with the present invention, the pressure of the oxidizing gas at the vicinity of the substrate was evacuated between $1\times10^{-6}$ and $5\times10^{-5}$ Torr at a background pressure of $1\times10^{-11}$ to $1\times10^{-9}$ Torr.

This quite low background pressure described above means that there is no leak nor any gas generation at the vacuum chamber of the apparatus. Therefore, no contaminant, for example hydrocarbonates or metal carbides, is deposited on or within the oxide thin film prepared by the process in accordance with the present invention.

In a preferred embodiment, the oxidizing gas is $O_2$ including more than 5 volume percent $O_3$ which has higher oxidation ability than pure $O_2$ appropriate to oxide thin film deposition.

In one preferred embodiment, the deposition process is conducted while the oxidizing gas is injected onto a specimen surface. By this, the partial pressure of the oxidizing gas around the deposition plane of the specimen was further elevated.

In one preferred embodiment, the oxide is formed of a dielectric oxide such as $SrTiO_3$. In this case, the deposition process is preferably conducted at a substrate temperature range from 330° to 530° C. by using metal strontium and metal titanium as evaporation sources to realize high dielectric constant of the oxide thin film. It is more preferable that the reactive co-evaporation deposition is done at a substrate temperature of 430° C. If the substrate temperature is lower than 330° C., the obtained $SrTiO_3$ oxide thin film has poor crystallinity. On the contrary, if the substrate temperature exceeds 530° C., dielectric properties of the $SrTiO_3$ oxide thin film may be degraded.

The above evaporation sources are preferably K cells. It is preferable that the crucible temperature of the K cell of the metal strontium is ranging form 450° to 600° C., more preferable 520° C. and the temperature of the K cell of the metal titanium is ranging form 1430° to 1550° C., more preferable 1500° C. The temperatures of the K cells are determined to obtain enough molecular flux for each metals, which are also effected by geometry of the MBE apparatus and the material in the crucibles.

In addition, the substrate can be formed of an insulating substrate, preferably an oxide single crystal substrate such as MgO, SrTiO$_3$, CdNdAlO$_4$, etc. These substrate materials are very effective in forming or growing a crystalline film having a high degree of crystallinity.

However, it is possible to deposit an oxide thin film on an oxide superconductor layer with little inter diffusion between them, in accordance with the present invention. For example, a SrTiO$_3$ thin film can be deposited on a Y$_1$TBa$_2$Cu$_3$O$_{7-x}$ oxide superconductor layer so as to prevent inter diffusion between them so that a clear SrTiO$_3$/Y$_1$Ba$_2$Cu$_3$O$_{7-x}$ interface should be formed. This process is favorably applicable to form a gate structure of a superconducting field effect device having a superconducting channel of an oxide superconductor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
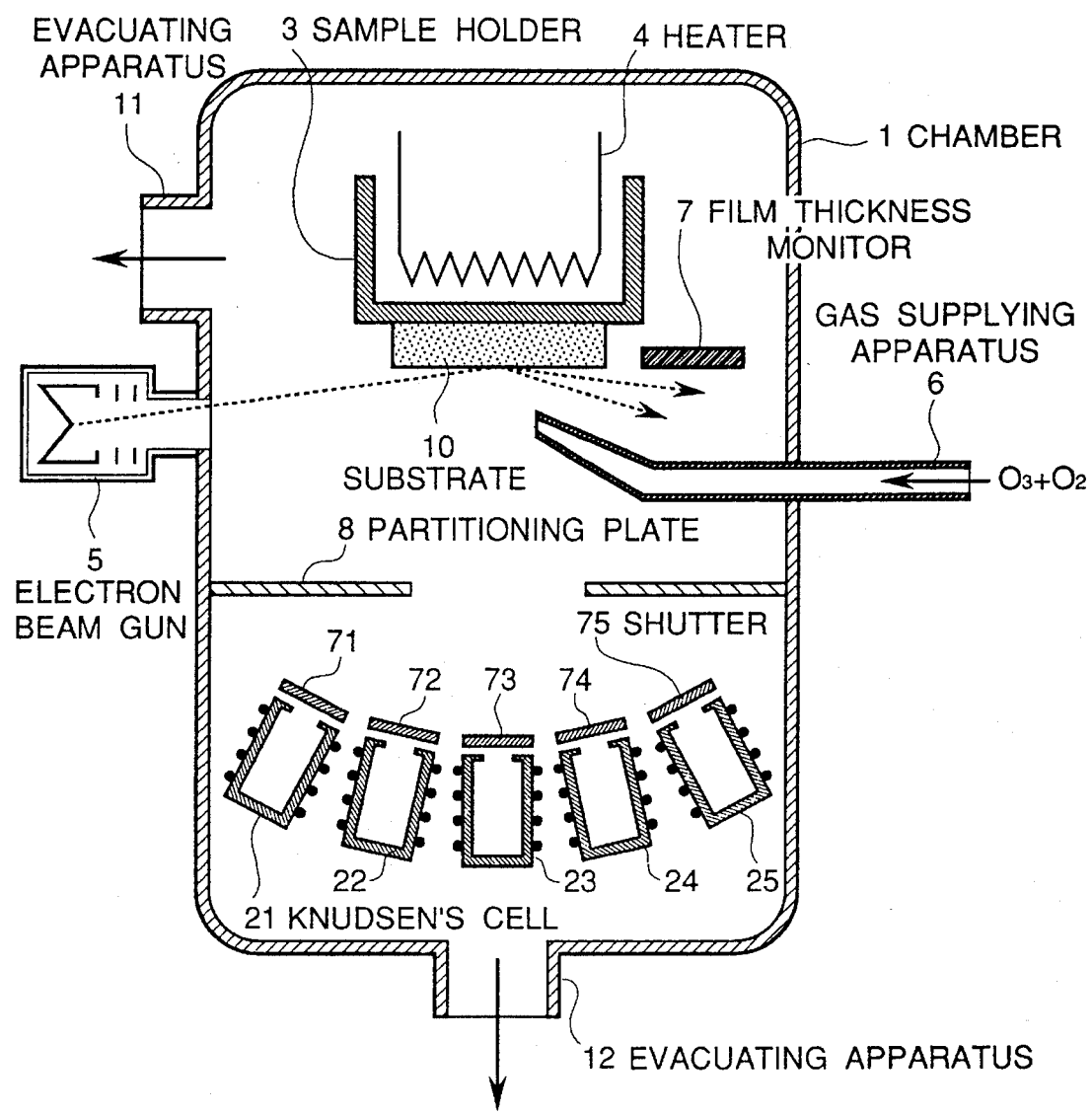
FIG. 1 is a diagrammatic sectional view of a film deposition apparatus which can be used for conducting the deposition process in accordance with the present invention.

Referring to FIG. 1 them is shown a diagrammatic sectional view of a film deposition apparatus which can be used for conducting the process in accordance with the present invention.

The shown film deposition apparatus includes a vacuum chamber 1 provided with evacuating apparatuses 11 and 12, five K cells 21 to 25 having controllable shutters 71 to 75 provided at the bottom of the vacuum chamber 1, and a sample holder 3 provided at the top of the vacuum chamber 1 for holding a substrate 10 on which a film is to be deposited. Shutters 71 to 75 and temperatures of the K cells 21 to 25 are independently controlled so that the amount of flux (molecular beam) of each material and deposition rate of each material are independently controlled. The sample holder 3 is contacted to a heater 4 for heating the substrate and a temperature sensor (not shown). A film thickness monitor 7 is provided near the sample holder 3. In addition, the vacuum chamber 1 also has an electron beam gun 5 of RHEED (Reflecting High Energy Electron Diffraction) measurement for observing a thin film roughness and crystallinity even during the deposition. Though not shown, a liquid nitrogen shroud for cooling outer shells of the K cells 21 to 25.

Additionally, a gas introducing nozzle 6 is provided so as to introduce an oxidizing gas such as O$_2$, O$_3$, NO$_2$, N$_2$O, etc. in the vicinity of the substrate 10 attached to the sample holder 3, so that the oxidizing gas can be supplied to form an oxygen-enriched atmosphere in the vicinity of the substrate 10 in order to oxidize metal molecular beams supplied from the evaporation sources in the course of the film deposition.

Furthermore, the film deposition apparatus additionally includes a partitioning plate 8 for dividing the vacuum chamber 1 into a bottom sub-chamber which consists of a lower portion of the vacuum chamber defined below the partitioning plate 8, which has the K cells 21 to 25 and the main evacuating apparatus 12, and a top sub-chamber which consists of an upper portion of the vacuum chamber defined above the partitioning plate 8 and in which sample holder 3 is located. The partitioning plate 8 includes a round shape opening formed at a center thereof. The position of the opening is determined to ensure that molecular beams emitted from K cells toward the substrate 10 are not obstructed by the partitioning plate 8. In addition, the size of the opening is determined to enable restricted oxygen leakage from the top sub-chamber to the bottom sub-chamber so that a pressure difference can be created between these two sub-chambers. Therefore, the partitioning plate 8 having the round shape opening acts as a vacuum conductance.

In addition, the evacuating apparatus 11 is coupled to the top sub-chamber for evacuating the top sub-chamber to an ultra-high vacuum. The auxiliary evacuating apparatus 11 is constituted of a cryopump. On the other hand, the evacuating apparatus 12 is constituted of a diffusion or turbo pumps.

EXAMPLE 1

Oxide thin films of SrTiO$_3$ were prepared by using the apparatus of FIG. 1.

First, a 0.05% Nb doped SrTiO$_3$ (100) substrate 10 was attached to the sample holder 3, and metal strontium having a purity of three nines and metal titanium having a purity of five nines were put into tantalum crucibles held witlain the two K cells 22 and 24 used for evaporation sources. Thereafter, inlets of the chamber 1 were closed and evacuation process by the evacuating apparatuses 11 and 12 began to reach an ultra-high vacuum which obtained a pressure lower than $1 \times 10^{-10}$ Torr, which was required to the background pressure during the film deposition by the MBE process. Succeedingly, an oxidizing gas of O$_2$ including 8 volume percent O$_3$ was supplied from the gas introducing nozzle 6 so that the pressure around the substrate 10 became $3 \times 10^{-5}$ Torr.

As mentioned above, the vacuum chamber 1 was provided with the vacuum conductance (the partitioning plate 8), a pressure difference of about one digit or more was created between the bottom sub-chamber and the top sub-chamber. Pressure of the bottom sub-chamber was maintained low enough to prevent the evaporation sources from oxidization and to maintain the metal molecular beams from each evaporation source during the deposition. In addition, the oxidizing gas injected from the gas introducing nozzle 6 was supplied onto a specimen surface, the partial pressure of the oxidizing gas on the deposition plane of the specimen was much increased.

Then, the substrate 10 was heated by the heater 4 to temperatures of from 280° to 680° C. The K cell 22 of metal strontium was heated to a temperature of 520° C. and the K cell 24 of metal titanium was heated to a temperature of 1500° C. The temperature of the K cell of metal strontium is preferably 450° to 600° C. and the temperature of the K cell of metal titanium is preferably 1430° C. to 1550° C. The temperatures of the K cells are determined by the amount of metal beam fluxes requested by the arrangement of the MBE apparatus and oxide composition.

When molecular beams had settled to their stable operation, the shutters 72 and 74 were opened so as to start deposition of the $SrTiO_3$ oxide thin film onto the substrate 10. At the same time, crystallinity of this deposited film surface was observed by the RHEED device. The $SrTiO_3$ oxide thin films were grown at a deposition rate of 1.2 nanometer/minute. The deposition rate is preferably 0.5 to 2 nanometers/minute.

In the above process, the deposition rate of the thin film was determined by the temperatures of the each K cell. Namely, the deposition rate was controlled by the amount of beam fluxes from the evaporation sources by changing their temperatures of the K cells. The substrate temperature was also effective on the crystallinity of the thin film. If the substrate temperature is too low, the thin film can not be crystalline, may be amorphous or polycrystalline. Oxygen content of the thin film was determined by partial pressure of the oxidizing gas during the deposition. In addition, composition of the thin film was determined by a ratio of the amount of beam fluxes the evaporation sources. Therefore, in accordance with the present invention, the composition of the thin film can be controlled during the deposition process so as to optimize properties of the thin film.

After the $SrTiO_3$ oxide thin films were obtained, properties of the oxide thin films were evaluated. FIGS. 3A, 3B, 3C and 3D show RHEED images of the $SrTiO_3$ oxide thin films deposited by the above process under the substrate temperatures of 280° C., 330° C., 530° C. and 680° C. It became clear that the $SrTiO_3$ oxide thin films having at least some crystallinity could be obtained by the deposition process under the substrate temperature higher than 300° C. from observation of RHEED.

Figure 2:
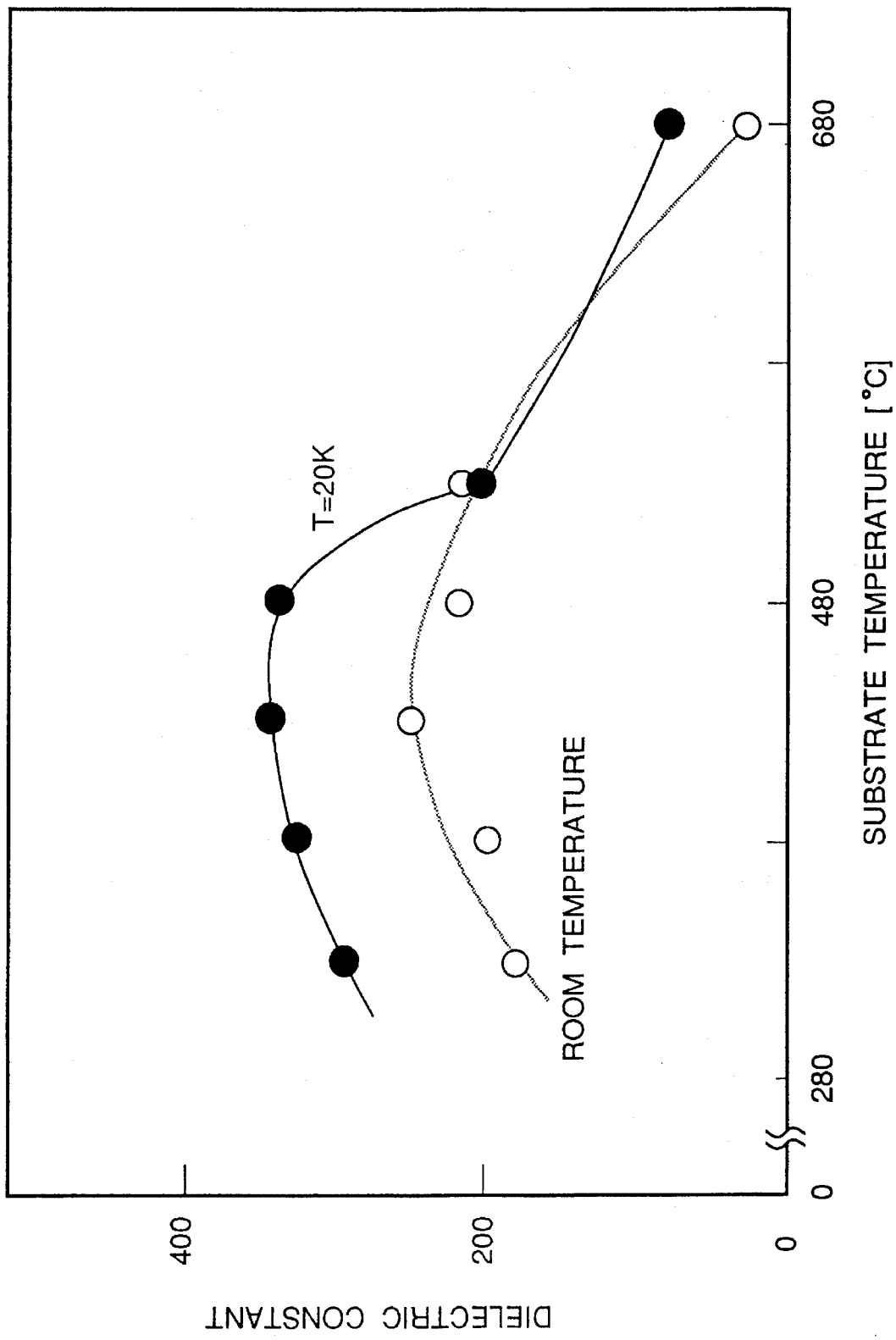
FIG. 2 is a graph of dielectric constants of SrTiO$_3$ thin films deposited by the process in accordance with the present invention against substrate temperatures under which the thin films were deposited.
Figure 3B:
FIGS. 3A to 3D are RHEED (Refractive High Energy Electron Diffraction) images of SrTiO$_3$ thin films deposited under substrate temperatures of 280° C., 330° C., 530° C. and 680° C.
Figure 3A:
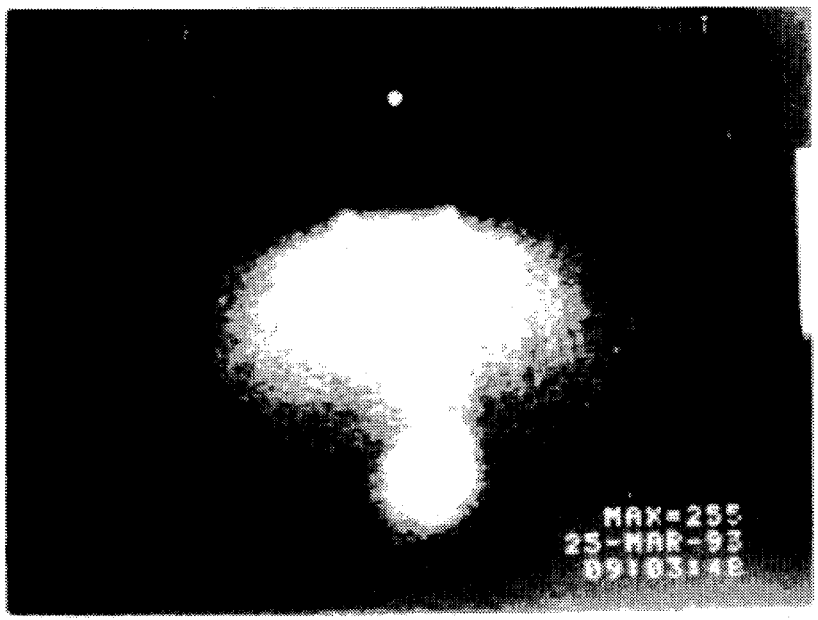
Figure 3D:
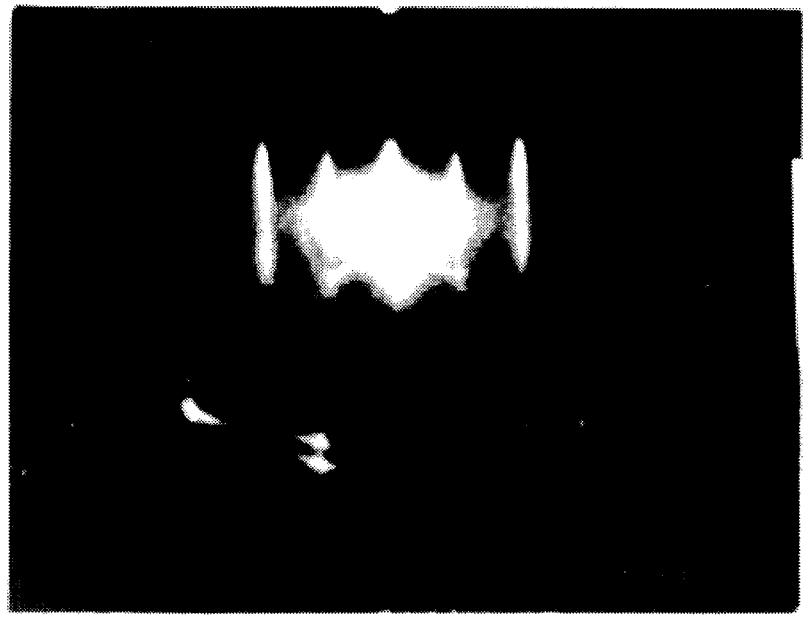
Figure 3C:

FIG. 2 shows the substrate temperatures, under which the thin films were deposited, dependence of dielectric constants of the $SrTiO_3$ thin films deposited by the above process. A solid circles show relations of dielectric constants of the $SrTiO_3$ thin films measured at 20K against the substrate temperatures. A open circles show relations of dielectric constants of the $SrTiO_3$ thin films measured at the room temperature against the substrate temperatures. As shown in FIG. 2, the $SrTiO_3$ thin films deposited by the process in accordance with the present invention, in which the substrate temperatures ranged 330° to 530° C., had relative dielectric constants of around 300 measured at 20K. The $SrTiO_3$ thin film deposited under the substrate temperature of 430° C. had the largest value of the dielectric constant.

Through observation by way of an atomic force microscope (AFM), it became clear that the $SrTiO_3$ thin films, deposited by the process in accordance with the present invention in which the substrate temperatures ranged 330° to 530° C., had smooth surfaces of which roughness was less than 5 nanometers.

As explained above, an oxide thin film which has an excellent surface properties can be obtained by the process in accordance with the present invention. The oxide thin film deposited by the process in accordance with the present invention has a crystalline, clean and smooth surface, and also shows large dielectric constant. In addition, it is possible to deposit $SrTiO_3$ thin films varying from semiconductor to insulator only by changing composition ratios of the thin films in accordance with the present invention.

EXAMPLE 2

Thin films of $SrTiO_3$ dielectric oxide were deposited on a $Y_1Ba_2Cu_3O_{7-x}$ oxide superconductor thin films formed on a $SrTiO_3$ (100) substrate by using the apparatus of FIG. 1.

At first, a $SrTiO_3$ (100) substrate 10 was attached to the sample holder 3, and metal yttrium, metal barium and metal copper were out into tantalum crucibles of three K cells 21, 23 and 25 used for evaporation sources of the oxide superconductor thin film. Metal strontium and metal titanium were also put into tantalum crucibles of two K cells 22 and 24 used for evaporation sources of the $SrTiO_3$ thin film. Thereafter, inlets of the chamber 1 were closed and evacuation process by the evacuating apparatuses 11 and 12 began to reach an ultra-high vacuum of which the pressure was lower than $1 \times 10^{-10}$ Torr, which was required to the background pressure during the film deposition by the MBE process. Succeedingly, an oxidizing gas of $O_2$ including 70 volume percent $O_3$ was supplied from the gas introducing nozzle 6 so that the pressure around the substrate 10 became $3 \times 10^{-5}$ Torr.

In this connection, a maximum $O_3$ content of the oxidizing gas supplied, using the apparatus of FIG. 1, was on the order of 70 volume percent near the substrate 10. $O_3$ was unstable and easily decomposed during supply. Therefore, even if pure $O_3$ of 100 volume percent was supplied, only $O_2$ including 70 volume percent $O_3$ or less reached around the substrate 10.

As mentioned above, the vacuum chamber 1 was provided with the vacuum conductance (the partitioning plate 8), a pressure difference of about one digit or more was created between the bottom sub-chamber and the top sub-chamber. Pressure of the bottom sub-chamber was maintained low enough to prevent the evaporation sources from oxidization and to maintain the metal molecular beams from each evaporation source during the deposition. In addition, the oxidizing gas injected from the gas introducing nozzle 6 was supplied onto a specimen surface, the partial pressure of the oxidizing gas on the deposition plane of the specimen was much increased.

Then, the substrate 10 was heated by the heater 4 to a temperature of 700° C. The K cell 21 of metal yttrium was heated to a temperature of 1220° C., the K cell 23 of metal barium was heated to a temperature of 620° C. and the K cell 25 of metal copper was heated to a temperature of 1000° C. It is preferable that the temperature of the K cell of the metal yttrium is 1150° to 1350° C., the temperature of the K cell of the metal barium is 570° to 640° C., and the temperature of the K cell of the metal copper is 950° to 1090° C. The temperatures of the K cells are determined by the amount of metal beam fluxes required to obtain appropriate composition ratio and deposition rates.

When molecular beams had settled to their stable operation, the shutters 71, 73 and 75 were opened so as to start deposition of the $Y_1Ba_2Cu_3O_{7-x}$ oxide superconductor thin film onto the substrate 10. At the same time, crystallinity of this deposited film was observed by the RHEED device. The oxide superconductor thin films were grown up to a thickness of from 10 to 100 nanometers at a deposition rate of 1 nanometer/minute. The deposition rate is preferably 0.5 to 2 nanometers/minute.

Then, the substrate temperature was lowered to 430° C., supplying ozone contained oxidation gas, and the K cell 22 of metal strontium was heated to a temperature of 520° C. and the K cell 24 of metal titanium was heated to a temperature of 1500° C. When molecular beams had settled to their stable operation, the shutters 72 and 74 were opened so as to start deposition of the $SrTiO_3$ oxide thin film onto the $Y_1Ba_2Cu_3O_{7-x}$ oxide superconductor thin film. At the same time, crystallinity of this deposited film was observed by the RHEED device, to make it clear that a single crystal $SrTiO_3$ oxide thin film was growing heteroepitaxially and homogeneously. The $SrTiO_3$ oxide thin films were grown up to a thickness of from 10 to 200 nanometers at a deposition rate of 1.2 nanometer/minute.

Thereafter, each of the substrates was transferred to another chamber, so that an Au film having a thickness of 200 nanometers was deposited on each $SrTiO_3$ oxide thin film.

In the above process, the $SrTiO_3$ oxide thin film was deposited on the $Y_1Ba_2Cu_3O_{7-x}$ oxide superconductor thin film at a substrate temperature of 430° C. and then the Au thin film was deposited on the $SrTiO_3$ oxide thin film. Inter diffusion between $Y_1Ba_2Cu_3O_{7-x}$ oxide superconductor and $SrTiO_3$ was completely prevented at this substrate temperature. Therefore, the multilayered structure including the $Y_1Ba_2Cu_3O_{7-x}$ oxide superconductor thin film, the $SrTiO_3$ oxide thin film and Au thin film had sharp interfaces with no inter diffusion each other, which was confirmed through the Auger Electron Spectroscopy (AES) analysis.

Therefore, the oxide superconductor thin film of thickness of 10 nanometers had the critical temperature $T_c$ of about 60K and the $SrTiO_3$ oxide thin film of thickness of 200 nanometers had the relative dielectric constant of around 400 at the specimen temperature of about 50K. These good properties of the $SrTiO_3/Y_1Ba_2Cu_3O_{7-x}$ multilayered structure are adequate for device application, for instance, superconducting field effect transistors (super-FET) or interdigital capacitances and so on.

Utilizing above method for fabrication $SrTiO_3/Y_1Ba_2Cu_3O_{7-x}$ multilayered structure, a field effect transistor of Ag (100 nm thick)/$SrTiO_3$ (250 nm thick)/$Y_1Ba_2Cu_3O_{7-x}$ (10 nm thick) was obtained, having transconductance $G_n$ of about 2 mS/cm for gate length and width of 100 μm and 300 μm, respectively.

Relatively low substrate temperature of less than 500° C. during $SrTiO_3$ thin film deposition lead the way to the semiconductor device application, such as gate insulator or capacitor of ferroelectric random access memory (FRAM).

The invention has thus been shown and described with reference to the specific embodiments. However, it should be noted that the present invention is in no way limited to the details of the illustrated structures but converts and modifications may be made within the scope of the appended claims.

We claim:

1. A process for preparing a film formed of $SrTiO_3$ oxide material on a substrate by using an apparatus comprising a vacuum chamber in which an oxidizing gas of $O_2$ including $O_3$ can be supplied near the substrate so that pressure around the substrate can be increased while maintaining high vacuum around an evaporation source and cell evaporation sources arranged in the vacuum chamber wherein the substrate is heated, molecular beam of constituent atoms of the oxide excluding oxygen are supplied from the K cell evaporation sources and an oxidizing gas is locally supplied to the vicinity of the substrate.

2. A process as claimed in claim 1, wherein the pressure of the oxidizing gas at the vicinity of the substrate becomes $1\times10^{-6}$ to $5\times10^{-5}$ Torr at a background pressure of $1\times10^{-11}$ to $1\times10^{-9}$ Torr.

3. A process as claimed in claim 1, wherein the oxidizing gas is $O_2$ including more than 5 volume percent $O_3$.

4. A process as claimed in claim 1, wherein the oxidizing gas is $O_2$ including 70 volume percent $O_3$.

5. A process claimed in claim 1, wherein the process is conducted while the oxidizing gas is supplied onto a deposition plane of the substrate.

6. A process as claimed in claim 1, wherein the process is conducted at a substrate temperature of 330° to 530° C.

7. A process as claimed in claim 6, wherein the process is conducted at a substrate temperature of 430° C.

8. A process as claimed in claim 1, wherein the process is conducted by using metal strontium and metal titanium as evaporation sources.

9. A process as claimed in claim 8, wherein the metal strontium and the metal titanium are put into crucibles of K cells.

10. A process as claimed in claim 9, wherein the process is conducted at a temperature of the K cell of the metal strontium of 450° to 600° C. and at a temperature of the K cell of the metal titanium of 1430° C. to 1550° C.

11. A process as claimed in claim 10, wherein the process is conducted at a temperature of the K cell of the metal strontium of 520° C. and at a temperature of the K cell of the metal titanium of 1500° C.

12. A process as claimed in claim 1, wherein the substrate has an oxide superconductor layer on its surface.

13. A process as claimed in claim 12, wherein the process is conducted at a substrate temperature at which inter diffusion were prevented between the $SrTiO_3$ oxide thin film and the oxide superconductor layer.

14. A process as claimed in claim 12, wherein the oxide superconductor layer is formed of $Y_1Ba_2Cu_3O_{7-x}$ oxide superconductor.

15. A process as claimed in claim 14, wherein the deposition of $SrTiO_3$ is conducted at a substrate temperature of 430° C.

16. A process as claimed in claim 12, wherein the oxidizing gas is $O_2$ including 70 volume percent $O_3$.

* * * * *

UNITED STATES PATENT AND TRADEMARK OFFICE
CERTIFICATE OF CORRECTION

PATENT NO. : 5,501,175
DATED : March 26, 1996
INVENTOR(S) : TANAKA et al

It is certified that error appears in the above-indentified patent and that said Letters Patent is hereby corrected as shown below:

Col. 8, Line 2 (Claim 1, Line 6) "and cell" should be

--and K cell--.

Signed and Sealed this

Fourteenth Day of January, 1997

Attest:

BRUCE LEHMAN

Attesting Officer          Commissioner of Patents and Trademarks